(12) United States Patent
Kook et al.

(10) Patent No.: US 10,593,634 B2
(45) Date of Patent: Mar. 17, 2020

(54) PACKAGED DEVICES WITH INTEGRATED ANTENNAS

(71) Applicant: Analog Devices, Inc., Norwood, MA (US)

(72) Inventors: Youn-Jae Kook, Winchester, MA (US); Yeonsung Kim, Bedford, MA (US); Dipak Sengupta, Boxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/396,107

(22) Filed: Dec. 30, 2016

(65) Prior Publication Data

US 2018/0190600 A1    Jul. 5, 2018

(51) Int. Cl.
*H01L 23/66* (2006.01)
*H01Q 1/22* (2006.01)
(Continued)

(52) U.S. Cl.
CPC .............. *H01L 23/66* (2013.01); *H01L 23/04* (2013.01); *H01L 23/3107* (2013.01); *H01L 23/49534* (2013.01); *H01L 23/49555* (2013.01); *H01L 23/49827* (2013.01); *H01L 23/552* (2013.01); *H01L 25/105* (2013.01); *H01Q 1/2283* (2013.01); *H01L 2223/6677* (2013.01); *H01L 2224/48091* (2013.01); *H01L 2224/48227* (2013.01); *H01L 2224/48247* (2013.01); *H01L 2224/48257* (2013.01);
(Continued)

(58) Field of Classification Search
None
See application file for complete search history.

(56) References Cited

U.S. PATENT DOCUMENTS

| 5,166,772 A | 11/1992 | Soldner et al. |
| 5,314,606 A | 5/1994 | Irie et al. |

(Continued)

FOREIGN PATENT DOCUMENTS

| CN | 104851878 A | 8/2015 |
| JP | H08-186430 | 7/1996 |

(Continued)

OTHER PUBLICATIONS

Ginsburg, B. et al., "A 160GHz pulsed radar transceiver in 65nm CMOS," IEEE J. Solid State Circuits, Apr. 2014, pp. 984-995.
(Continued)

*Primary Examiner* — Erik Kielin
(74) *Attorney, Agent, or Firm* — Knobbe, Martens, Olson & Bear, LLP

(57) ABSTRACT

Various embodiments of an integrated device package with integrated antennas are disclosed. In some embodiments, an antenna can be defined along a die pad of the package. In some embodiments, an antenna can be disposed in a first packaging component, and an integrated device die can be disposed in a second packaging component. The first and second packaging components can be stacked on one another and electrically connected. In some embodiments, a package can include one or a plurality of antennas disposed along a wall of a package body. The plurality of antennas can be disposed facing different directions from the package.

20 Claims, 7 Drawing Sheets

(51) Int. Cl.
*H01L 23/31* (2006.01)
*H01L 23/495* (2006.01)
*H01L 23/498* (2006.01)
*H01L 23/552* (2006.01)
*H01L 25/10* (2006.01)
*H01L 23/04* (2006.01)

(52) U.S. Cl.
CPC ............... *H01L 2224/49109* (2013.01); *H01L 2224/49171* (2013.01); *H01L 2924/15192* (2013.01); *H01L 2924/181* (2013.01)

(56) References Cited

U.S. PATENT DOCUMENTS

| | | | |
|---|---|---|---|
| 6,686,649 B1* | 2/2004 | Mathews | H01L 23/552 257/659 |
| 6,947,005 B2 | 9/2005 | Aisenbrey | |
| 7,049,682 B1 | 5/2006 | Mathews et al. | |
| 7,945,231 B2 | 5/2011 | Hoegerl et al. | |
| 8,164,167 B2 | 4/2012 | Zhang et al. | |
| 8,754,815 B2 | 6/2014 | Leem | |
| 8,952,521 B2 | 2/2015 | Wojnowski et al. | |
| 8,963,299 B2 | 2/2015 | Lin et al. | |
| 9,001,002 B2 | 4/2015 | Montevirgen et al. | |
| 9,064,787 B2 | 6/2015 | Boeck et al. | |
| 2002/0149521 A1* | 10/2002 | Hendler | H01Q 1/36 343/700 MS |
| 2002/0167060 A1* | 11/2002 | Buijsman | H01L 23/552 257/423 |
| 2004/0233648 A1* | 11/2004 | Ajioka | H01L 23/055 361/752 |
| 2005/0069277 A1 | 3/2005 | Nakazawa et al. | |
| 2005/0285794 A1* | 12/2005 | Tang | H01L 23/04 343/700 MS |
| 2006/0276157 A1 | 12/2006 | Chen et al. | |
| 2009/0168367 A1 | 7/2009 | Fujii | |
| 2010/0127937 A1 | 5/2010 | Chandrasekaran et al. | |
| 2011/0169115 A1* | 7/2011 | Lin | H01L 23/053 257/428 |
| 2013/0225102 A1* | 8/2013 | Tsutsumi | H01L 23/552 455/90.2 |
| 2014/0110840 A1* | 4/2014 | Wojnowski | H01L 23/49822 257/738 |
| 2014/0117473 A1* | 5/2014 | Kierse | H01L 29/84 257/416 |
| 2014/0254979 A1* | 9/2014 | Zhang | H01P 11/002 385/14 |
| 2015/0145747 A1 | 5/2015 | Chung et al. | |
| 2015/0280320 A1 | 10/2015 | Haroun et al. | |
| 2015/0288053 A1 | 10/2015 | Saxe et al. | |
| 2015/0295305 A1 | 10/2015 | Herbsommer et al. | |
| 2016/0218072 A1 | 7/2016 | Liao et al. | |
| 2016/0300781 A1 | 10/2016 | Xue et al. | |

FOREIGN PATENT DOCUMENTS

| | | |
|---|---|---|
| JP | 2008-543092 A | 11/2008 |
| WO | WO 2006/133108 A2 | 12/2006 |
| WO | WO 2015/088486 A1 | 6/2015 |

OTHER PUBLICATIONS

Huang, K. et al., "60GHz on-chip patch antenna integrated in a 0.13um CMOS technology," in IEEE ICUWB, 2010.

Kim, J. et al., "Application of Through Mold Via (TMV) as PoP base package," Research and Development Center, Amkor Technology Korea Inc., http://www.amkor.com/index.cfm?objectid=8AF3D477-A82F-2A80-71C758C65BF1ADA7, printed Mar. 13, 2017, 5 pages.

Tsukizawa, T. et al., "A fully integrated 60GHz CMOS transceiver chipset based on WiGig/IEEE802.11ad with built-in self calibration for mobile applications," in IEEE ISSCC Dig. Tech, 2013, pp. 230-231.

Vidojkovic, V. et al., "A low power radio chipset in 40nm LP CMOS with beamforming for 60GHz high data rate wireless communications," in IEEE ISSCC Dig. Tech, 2013, pp. 236-237.

Partial European Search Report dated May 3, 2018 for EP Application No. 17209982.2, 13 pages.

Extended European Search Report dated Aug. 20, 2018 for EP Application No. 17029982.2 in 11 pages.

Extended European Search Report dated Apr. 15, 2019, for EP Application No. 19150523.9, 10 pages.

Office Action issued in Japanese application No. 2017-251382 dated May 13, 2019.

Office Action issued in Japanese application No. 2017-251382 dated Jan. 14, 2020.

* cited by examiner

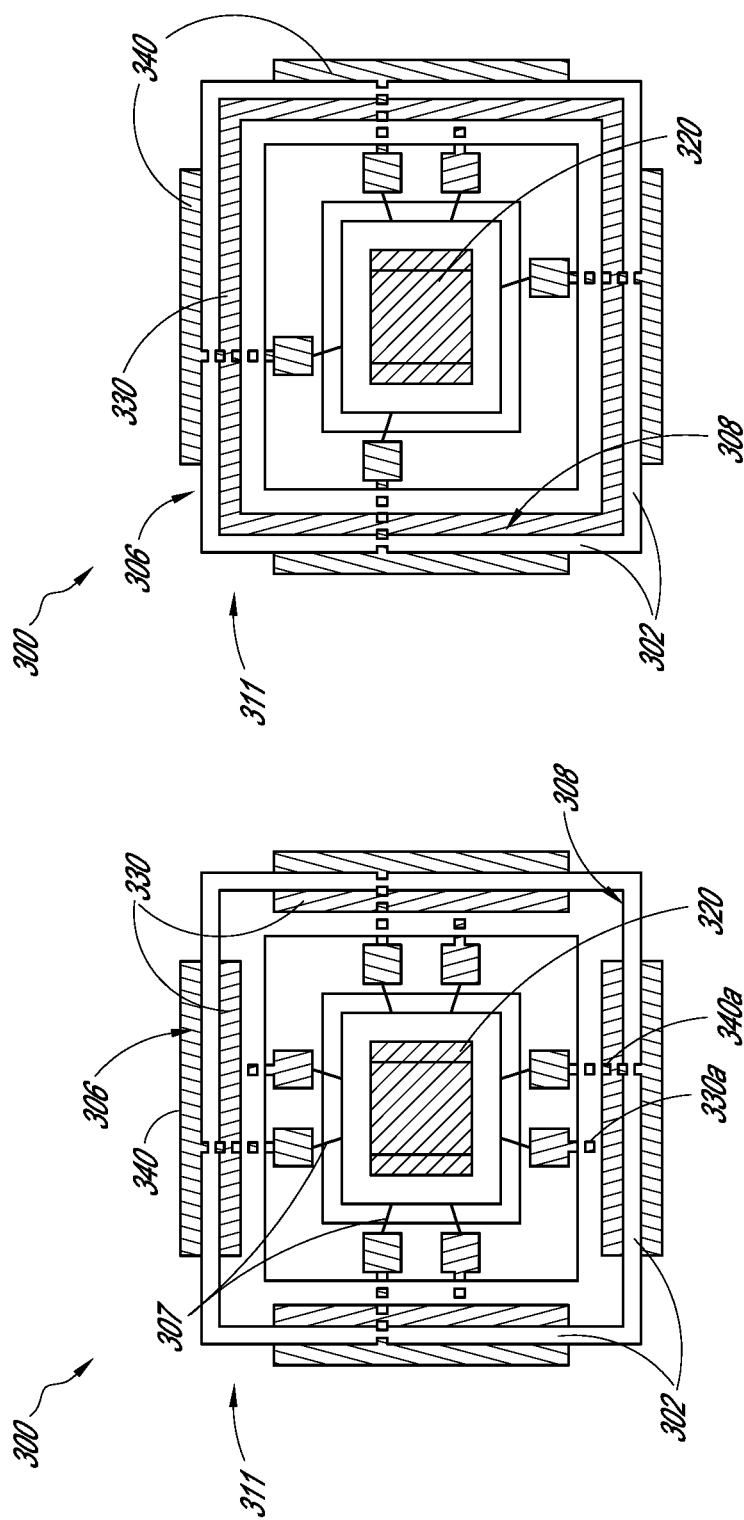

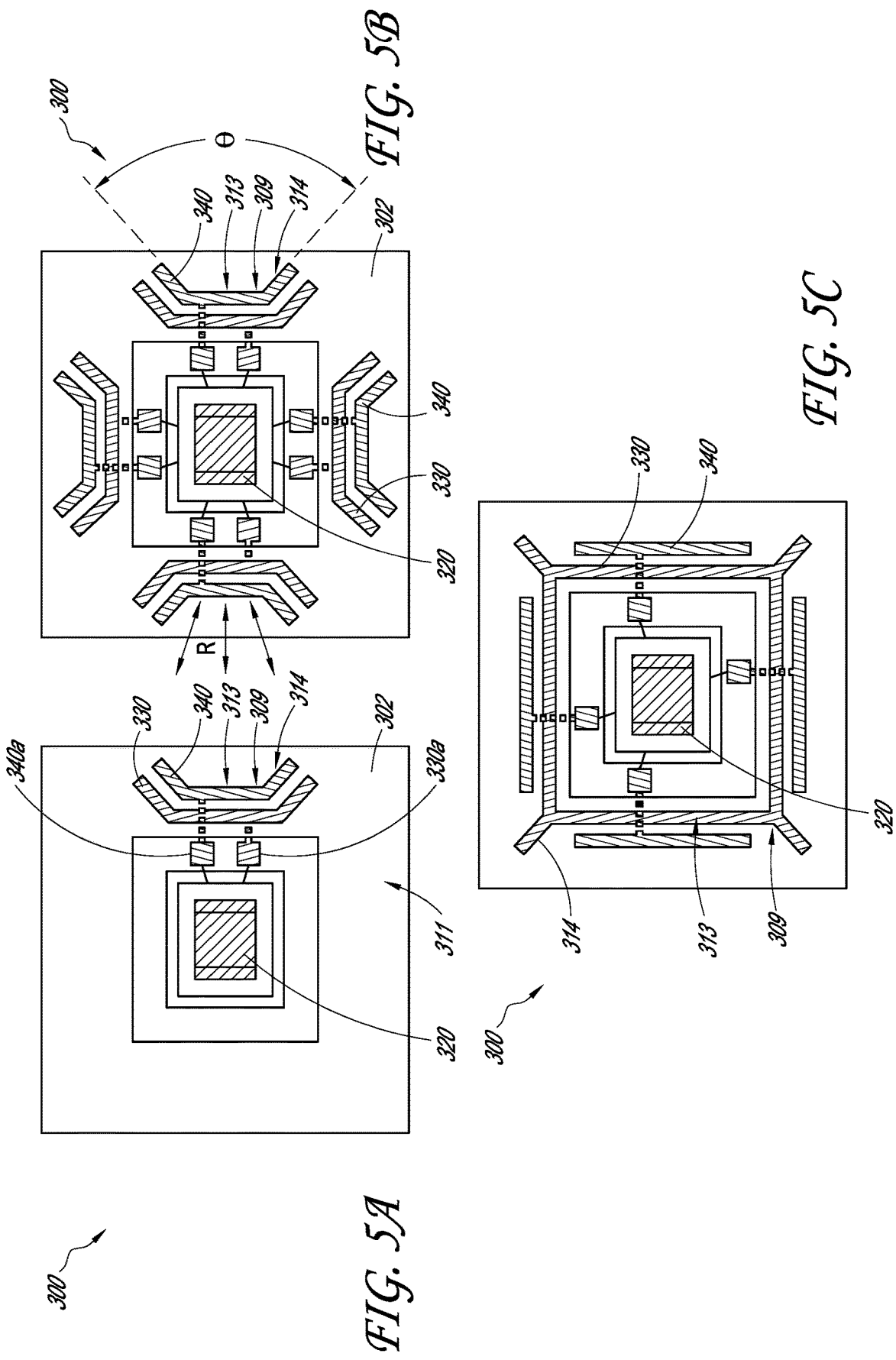

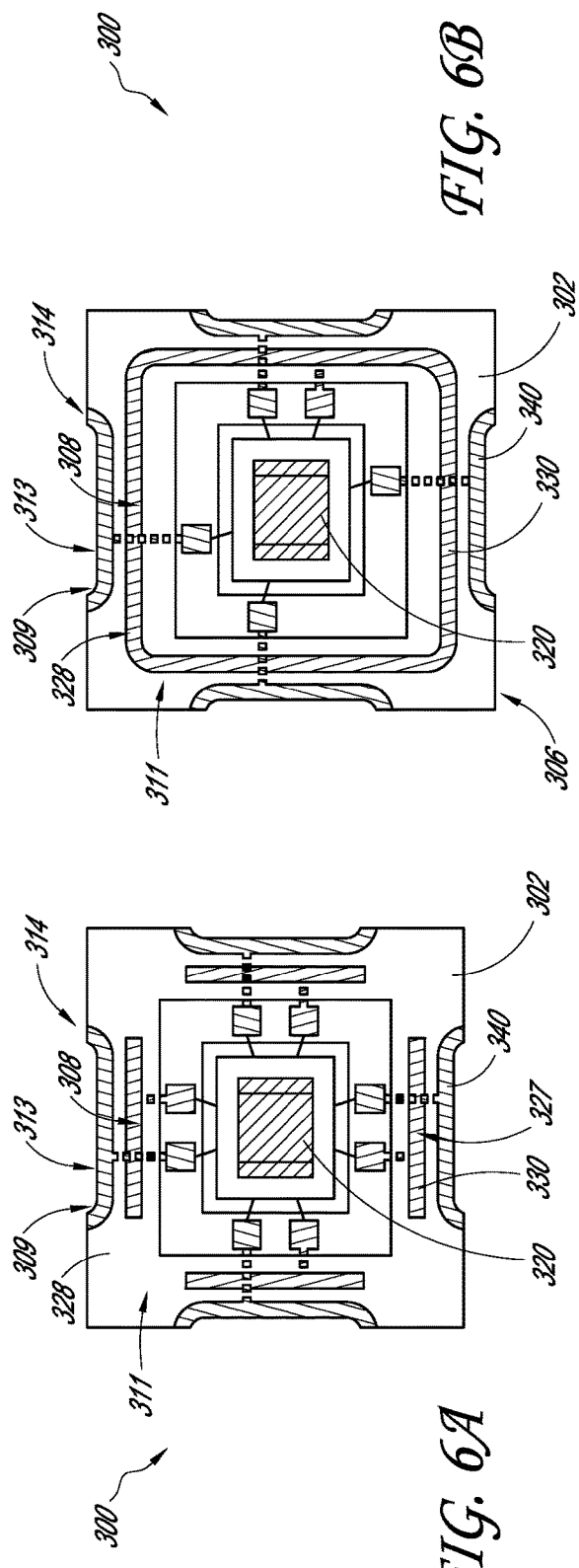
FIG. 6A
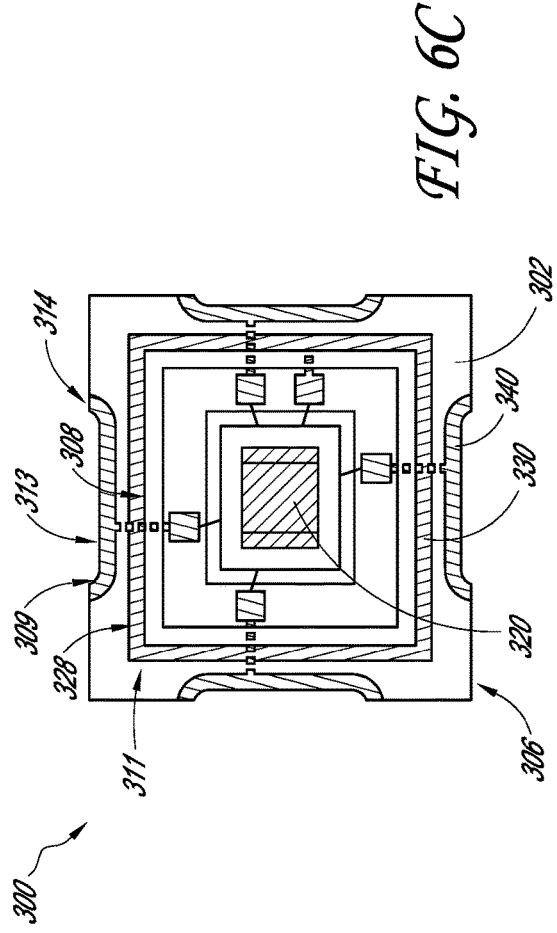
FIG. 6B
FIG. 6C

PACKAGED DEVICES WITH INTEGRATED ANTENNAS

BACKGROUND OF THE INVENTION

Field of the Invention

The field relates generally to packaged integrated devices, and, more particularly, to packaged integrated devices with integrated antennas.

Description of the Related Art

Antennas are used with electronic systems for wirelessly transmitting and/or receiving electromagnetic waves. For example, some antennas may be provided for wireless communication with other electronic systems or devices. Other antennas may be provided for wireless communication within the particular electronic system. In some electronic systems, the antennas may be integrated on the system board (board-mounted antennas) to which one or more integrated device packages are mounted. In other electronic systems, the antennas may be integrated within the integrated device die (die-integrated antennas). However, board-mounted antennas or die-integrated antennas may not provide adequate wireless communication at some wavelength ranges (such as millimeter wavelength ranges). Accordingly, there remains a continuing need for improved integration of antennas.

SUMMARY OF THE INVENTION

In one embodiment, a packaged integrated device is disclosed. The packaged integrated device can comprise a die pad. The die pad can comprise a radiating element defining a first side of the die pad and a grounded element. A non-conductive material can be disposed between the radiating element and the grounded element. An integrated device die can be mounted on a second side of the die pad. The integrated device die can be electrically connected to the radiating element and the grounded element.

In another embodiment, a packaged integrated device is disclosed. The packaged integrated device can include a first package component. The first package component can include a radiating element and a grounded element. The first package component can include a first package body in which the radiating element and the grounded element are disposed. A first interconnect can provide electrical connection with the radiating element. A second interconnect can provide electrical connection with the grounded element. The packaged integrated device can comprise a second package component. The second package component can comprise an integrated device die and a second package body in which the integrated device die is disposed. The integrated device die can be electrically connected to the first interconnect and the second interconnect.

In another embodiment, a packaged integrated device is disclosed. The packaged integrated device can include a package body comprising a base and at least one wall extending non-parallel from the base. The packaged integrated device can include an integrated device die mounted to the base within the package body. A radiating element can be disposed along the at least one wall of the package body. A grounded element can be disposed along the at least one wall of the package body and positioned between the radiating element and the integrated device die.

All of these embodiments are intended to be within the scope of the invention herein disclosed. There and other embodiments will become readily apparent to those skilled in the art from the following detailed description of the preferred embodiments having referenced to the attached figures, the invention not being limited to any particular embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein:

FIG. 4C is a schematic top cross-sectional view of a packaged integrated device with grounded elements disposed on an interior surface of the package and radiating elements disposed on an exterior surface of the package, according to another embodiment.

FIG. 4D is a schematic top cross-sectional view of a packaged integrated device with continuously connected sidewall ground plates according to another embodiment.

FIG. 5A is a schematic top cross-sectional view of a packaged integrated device that includes a castellated antenna in the wall of the package body, according to another embodiment.

FIG. 5B is a schematic top cross-sectional view of a packaged integrated device with a plurality of castellated antennas, according to another embodiment.

FIG. 5C is a schematic top cross-sectional view of a packaged integrated device with a plurality of antennas and continuously connected sidewall ground plates, according to yet another embodiment.

FIG. 6A is a schematic top sectional view of a packaged integrated device having a plurality of castellated antennas exposed along multiple walls of the package, according to another embodiment.

FIG. 6B is a schematic top sectional view of a packaged integrated device having a plurality of castellated antennas exposed along multiple walls of the package and continuously connected sidewall ground plates.

FIG. 6C is a schematic top sectional view of a packaged integrated device having a plurality of castellated antennas exposed along multiple walls of the package and continuously connected sidewall ground plates, according to another embodiment.

DETAILED DESCRIPTION OF THE PREFERRED EMBODIMENT

Packaged integrated devices will be described while referring to the accompanying drawings. The drawings are schematic and not to scale.

Various embodiments disclosed herein integrate one or more antennas into integrated device packages, as opposed to mounting an antenna to a system-level board or defining an antenna on an integrated device die (such as a processor die). Beneficially, the integration of antennas into a device package can enable communications at millimeter wavelength ranges (e.g., at wavelengths in a range of 30 GHz to 300 GHz), since the overall size of many integrated devices packages may be on the order of 1 mm to 5 cm. By contrast, it may be challenging to provide millimeter wavelength communications with board-mounted antennas or die-integrated antennas. For example, board-mounted antennas may occupy valuable space on the system board, which increases the overall size and complexity of the system board design. Further, it can be challenging to provide antennas on or within an integrated device die that are sized to receive and/or transmit millimeter-wavelength signals.

Accordingly, various embodiments disclosed herein utilize packaging structures to define antennas on or within the package. The packaging structures can advantageously enable the design of antennas having different shapes, sizes, and/or orientations, which can enable wireless communication over a wide range of wavelengths (e.g., at multiple frequencies in a range of 2 GHz to 200 GHz). Moreover, the antennas can be shaped and positioned within the package so as to create desirable beamforming and/or directional capabilities, which may be otherwise challenging to accomplish in board-mounted or die-integrated antennas, particularly for high frequency applications. In addition, integrating the antenna within the package can improve the performance of the system, since the signal pathways between the antennas and the associated integrated device dies may be shortened. Beneficially, the antennas described herein can be manufactured using the packaging techniques and/or materials that are used to package the die.

A. Die Pad with Antenna

Figure 1A:
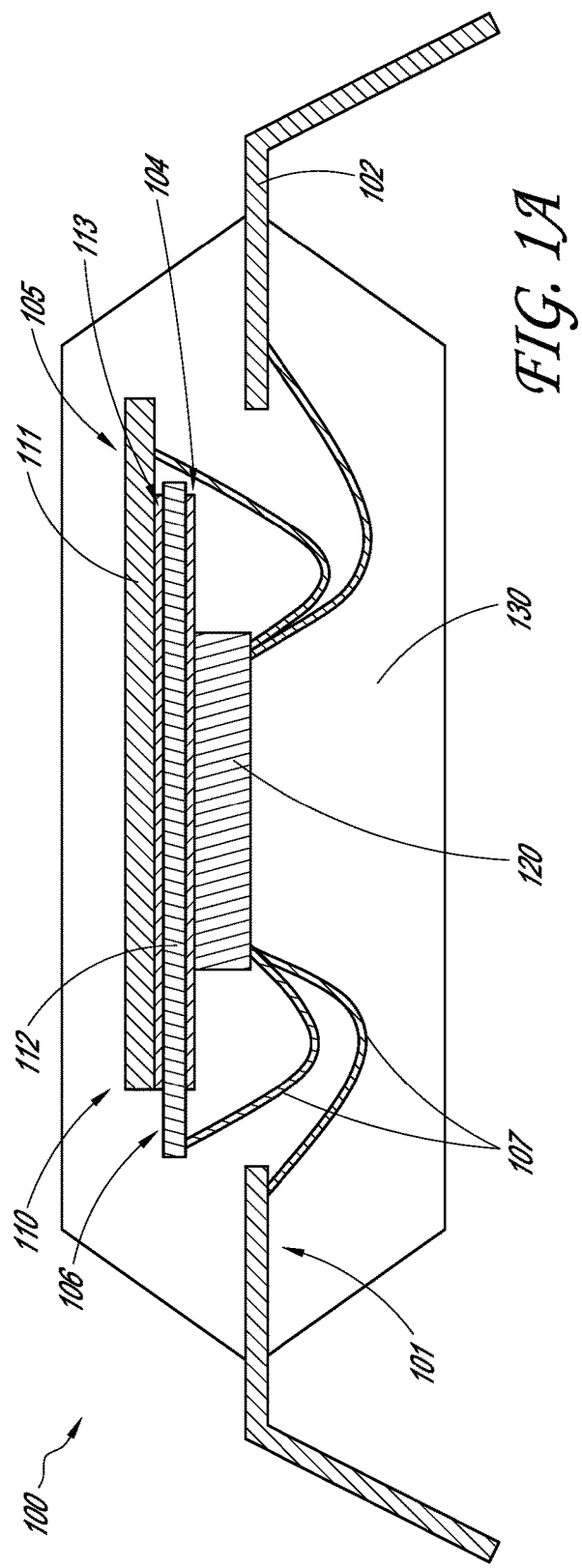
FIG. 1A is a schematic side cross-sectional view of a packaged integrated device in which a die pad defines an antenna of the packaged device.
Figure 1B:
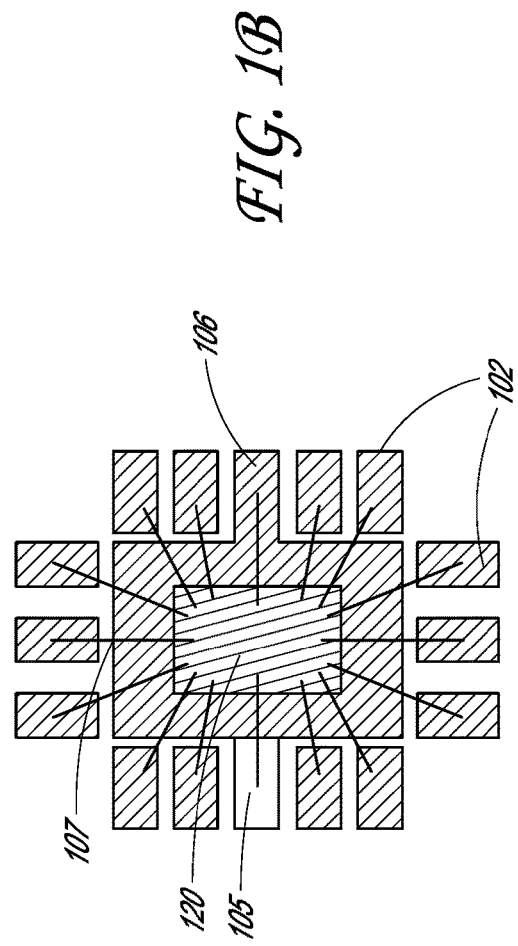
FIG. 1B is a schematic bottom plan view of the packaged integrated device of FIG. 1A, with the molding material omitted for ease of illustration.

In some embodiments, one or more antennas can be defined by at least a portion of a die pad of a packaged integrated device. FIG. 1A is a schematic side cross-sectional view of a packaged integrated device 100 (also referred to as an integrated device package, or package), according to one embodiment. FIG. 1B is a schematic bottom plan view of the packaged integrated device 100 of FIG. 1A, with the molding material (e.g., molding material 130) omitted for ease of illustration. The packaged integrated device 100 can comprise a package substrate 101 defined by a patterned metallic leadframe. The package substrate 101 can include a die pad 110 and a plurality of leads 102 disposed about the periphery of the die pad 110. The die pad 110 can comprise or define an antenna including a radiating element 111 that defines a first side of the die pad 110, and a grounded element 112, which can define a second side of the die pad 110. A non-conductive material 113 can be disposed between the radiating element 111 and the grounded element 112. In various embodiments, the non-conductive material 113 can comprise an adhesive, such as a non-conductive die attach material, e.g., an epoxy. In other embodiments, an additional dielectric material can be provided between the radiating element 111 and the grounded element 112. For example, the additional dielectric material can comprise a ceramic or FR4 board. With the additional dielectric material, the space between the radiating element and the grounded element, and the dielectric constant, can be controlled. Thus, various components of the die pad 110 (e.g., the radiating element 111, the grounded element 112, and the intervening non-conductive material 113) can define an antenna for transmitting and/or receiving signals for the packaged integrated device 100.

In various embodiments, both the radiating element 111 and the grounded element 112 can comprise a portion of a respective leadframe substrate, e.g., the radiating element 111 and the grounded element 112 can comprise portions of respective patterned metallic plates or sheets (such as a patterned copper plate or sheet). In some embodiments, the radiating element 111 can be defined from a first leadframe substrate and the grounded element 112 can be defined from a second leadframe substrate. The radiating element 111 and grounded element 112 can be placed on top of one another and attached with an adhesive (e.g., a nonconductive adhesive). In some embodiments, the thickness of the radiating element 111 and the grounded element 112 may be the same. The thickness of the radiating element 111 and/or the grounded element 112 may also be about the same as the thickness of the leads 102. In other embodiments, the thickness of the radiating element 111 and the grounded element 112 may differ. For example, the thickness of the radiating element 111 and the grounded element 112 may be in a range of 0.01 mm to 0.4 mm. In other embodiments, however, the thicknesses of the radiating element 111 and the grounded element 112 may differ. In some embodiments, the radiating element 111 can comprise a metal strip adhered to the grounded element 112. In still other embodiments, one or both of the radiating element 111 and the grounded element 112 can comprise a non-conductive plate with patterned metal to define the radiating and/or grounded portions of the antenna. In various embodiments, the packaged integrated device 100 can include a multi-layered substrate with a first metallic layer that defines the grounded element 112, a second metallic layer that defines the radiating element 111, and an intervening dielectric layer that defines the non-conductive material 113.

An integrated device die 120 can be mounted to the second side of the die pad 110, e.g., to the grounded element 112. An adhesive 104 can be used to attach the die 120 to the die pad 110. In various embodiments, the adhesive 104 can comprise a die attach material, which may be the same as or different from the non-conductive material 113. The integrated device die 120 can comprise any suitable type of device die, such as a processor die (e.g., an Application Specific Integrated Circuit, or ASIC), a sensor die, a memory die, etc. In addition, in various embodiments, multiple dies may be provided in the package 100 in various arrangements. In some embodiments, the die 120 can comprise processing circuitry defined at or near an active surface of the die 120. The integrated device die 120 can electrically communicate with the leads 102, the radiating element 111, and the grounded element 112. For example, one or more bonding wires 107 can connect bond pads of the integrated device die 120 to the leads 102. The electrical connections between the leads 102 and the integrated device die 120 can comprise signals that are to be transferred between the die 120 and a motherboard (not shown) of the larger electronic system to which the package 100 is to be mounted.

As shown in FIGS. 1A-1B, the integrated device die 120 can also electrically communicate with the grounded element 112 and the radiating element 111 by way of bonding wires 107. For example, the grounded element 112 can comprise a grounded lead extension 106 that extends outwardly from the grounded element 112. The grounded lead extension 106 can comprise an exposed metal extension that electrically connects the die 120 to electrical ground. Similarly, the radiating element 111 can comprise a radiating lead extension 105 that extends outwardly from the radiating element 111. The radiating lead extension 105 can comprise an exposed metal extension that electrically connects the die 120 to the radiating element of the antenna. The grounded lead extension 106 and the radiating lead extension 105 can enable the die 120 to electrically connect to both the radiating element 111 and the grounded element 112, which may be disposed generally parallel to one another. During operation, therefore, the grounded element 112 can connect the antenna to electrical ground, and the radiating element 111 can transmit and/or receive electromagnetic signals for wireless communication between the die 120 and other electronic components (which may be within the same electronic system or in a remote system).

In addition, in some embodiments, the packaged integrated device 100 can further include a molding material 130 that is applied over the integrated device die 120 and the die pad 110, such that the die 120 and die pad 110 are at least partially embedded in the molding material 130. In the illustrated embodiment, for example, the die 120 and the die pad 110 are completely embedded in the molding material 130. In other embodiments, however, the package body may not include a molding material. Beneficially, the embodiment of FIGS. 1A and 1B enables the integration of an antenna into the die pad 110 of the package 100 using the same packaging techniques and structures for packaging and electrically connecting the integrated device die 120.

B. Antennas for Stacked Packages

Various embodiments disclosed herein relate to integrated device packages in which a first package component is stacked on a second package component. The first package component can comprise an antenna including a radiating element and a grounded element. The second package component can comprise a packaged integrated device that is electrically coupled with the antenna in the second package component. Beneficially, the stacked package components disclosed herein can enable the integration of millimeter wave antennas into device packages using packaging structures and techniques. Integration of the antenna using packaging structures can also improve the signal integrity and reduce the overall footprint used by the antenna, as compared with board-level techniques.

Figure 2:
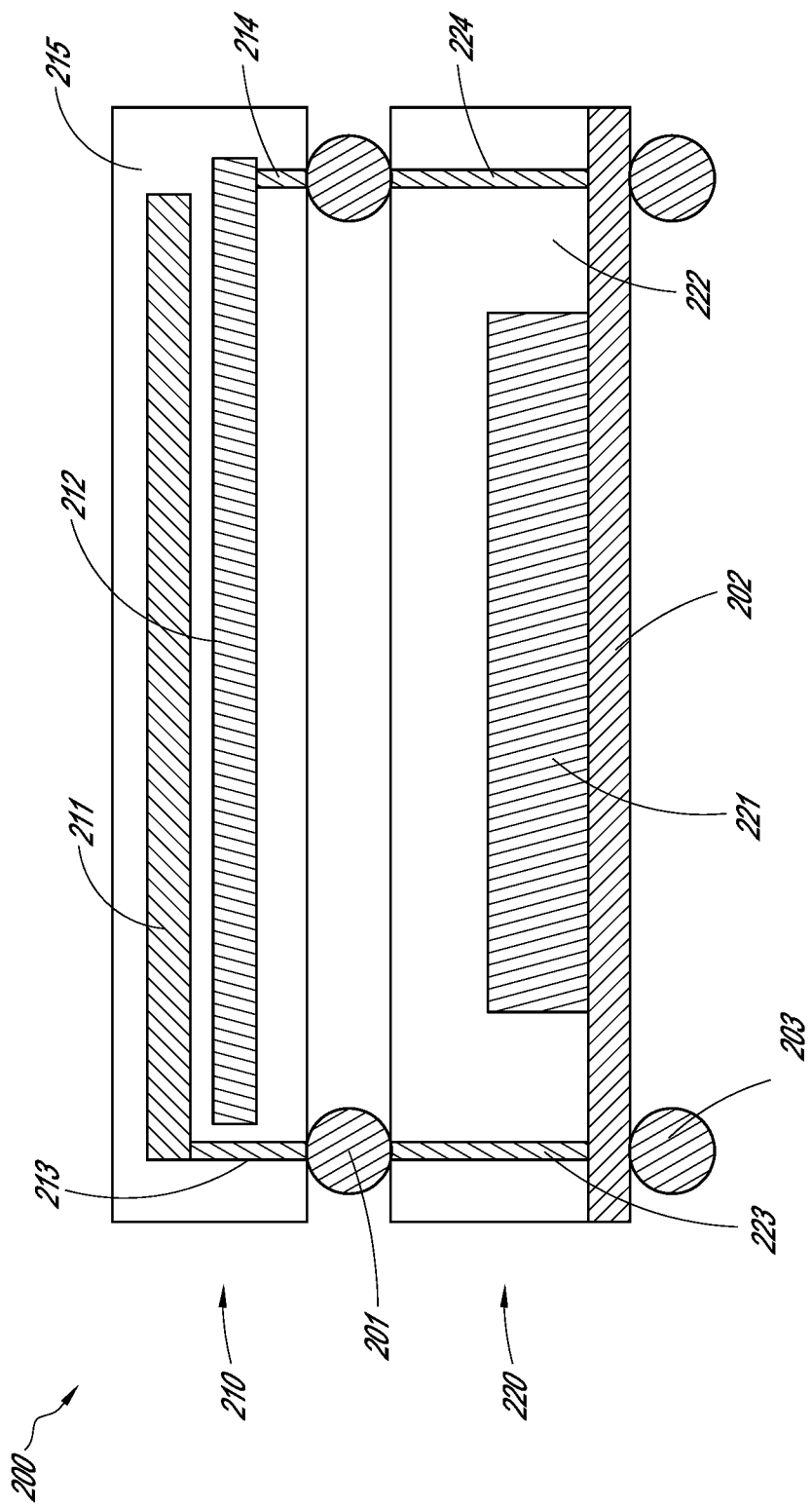
FIG. 2 is a schematic side cross-sectional view of a packaged integrated device including a first packaging component stacked on a second packaging component, according to another embodiment.

FIG. 2 is a schematic side cross-sectional view of a packaged integrated device 200 (or package) according to one embodiment. The packaged integrated device 200 can comprise a first package component 210 stacked on, and electrically connected with, a second package component 220. The first package component 210 can comprise an antenna that includes a radiating element 211 and a grounded element 212, which may be similar to the radiating and grounded elements described above in connection with FIGS. 1A-1B. For example, as explained above, one or both of the radiating element 211 and the grounded element 212 can comprise a patterned metallic plate or sheet, a non-conductive plate with patterned metal, or any other suitable structure that defines the antenna. The first package component 210 can further include a first interconnect 213 that provides electrical connection with the radiating element 211 and a second interconnect 214 that provides electrical connection with the grounded element 212.

As shown in FIG. 2, the first package component 210 can further include a first package body 215 in which the radiating element 211 and the grounded element 212 are disposed. In the illustrated embodiment, the first package body 215 comprises dielectric material, such as a molding compound applied over the radiating element 211 and the grounded element 212. In other embodiments, however, the first package component 210 can comprise any other suitable type of package body, such as a housing that defines a cavity, or laminate layers of dielectric material as in a PCB substrate.

In FIG. 2, the first and second interconnects 213, 214 comprise conductive through-mold vias (TMVs) that are formed through the non-conductive molding compound of the first package body 215. As illustrated, the radiating element 211 and the grounded element 212 can be completely embedded in the molding compound of the first package body 215 such that a portion of the molding compound is disposed between and electrically separates the radiating element 211 and the grounded element 212. In the illustrated embodiment, the first package component 210 does not include an integrated device die; however, in other embodiments, the first package component 210 can further include one or more integrated device dies (such as a processor die, memory die, sensor die, etc.).

As shown in FIG. 2, the first package component 210 can be electrically connected to the second package component 220 by way of a plurality of electrical connectors 201. In the illustrated embodiment, the plurality of electrical connectors 201 comprises a plurality of solder balls. The second package component 220 can comprise a packaged integrated device die. For example, the second package component 220 can include a package substrate 202 and an integrated device die 221 mounted to the package substrate 202. The package substrate 202 can comprise any suitable type of substrate, such as a printed circuit board (PCB), leadframe, molded leadframe, ceramic substrate, etc. The integrated device die 221 can comprise any suitable type of device die, such as a processor die (e.g., Application Specific Integrated Circuit, or ASIC), a memory die, a sensor die, etc. The integrated device die 221 can be electrically connected to the package substrate 202 in any suitable manner. For example, in some embodiments, the integrated device die 221 can be wire bonded to the substrate 202. In other embodiments, the integrated device die 221 can be flip chip mounted to the substrate by way of solder balls or other connectors.

The second package component 220 can further include a second package body 222 in which the integrated device die 221 is disposed. As with the first package component 210, the second package body 222 can comprise a molding compound applied over the integrated device die 221 such that the die 221 is at least partially embedded in the molding compound. The second package component 220 can further include a third interconnect 223 and a fourth interconnect 224. As with the first package component 210, the third and fourth interconnects 223, 224 can comprise conductive TMVs disposed through the molding compound of the second package body 222. The third interconnect 223 can connect an upper surface of the package substrate 202 to the first interconnect 213 by way of a corresponding intervening electrical connector 201. The fourth interconnect 224 can connect the upper surface of the package substrate 202 to the second interconnect 214 by way of another corresponding connector 201. The integrated device die 221 can electrically connect to the third and fourth interconnects 223, 224 by way of internal traces of the substrate 202.

Thus, the die 221 can electrically communicate with the radiating element 211 and the grounded element 212 by way of conductive traces of the substrate, the third and fourth interconnects 223, 224, the electrical connectors 201, and the first and second interconnects 213, 214. Second electrical connectors 203 (e.g., solder balls) can electrically connect the package 200 with a system motherboard (not shown) for integration into the larger electronic system. Beneficially, the embodiment of FIG. 2 can enable the use of packaging techniques to provide an antenna (e.g., the radiating element 211, the grounded element 212, and intervening molding compound) in a first package component that is stacked and electrically connected with a second package component that includes the integrated device die 221. The use of such stacked packaging techniques can provide an efficient and cost effective way to integrate antennas in the package 200, while improving signal integrity.

It should be appreciated that, in other embodiments, one or both of the package bodies 215, 222 can comprise package housings that define respective cavities in which the components are disposed. Moreover, in other embodiments, the electrical interconnects can comprise wire bonds or other suitable conductive interconnects that can be used to electrically connect the first and second package components 210, 220. Similarly, the internal electrical interconnects can comprise TMVs as shown, or can comprise traces on or within package walls.

C. Packages with Directional Antennas

Figure 3A:
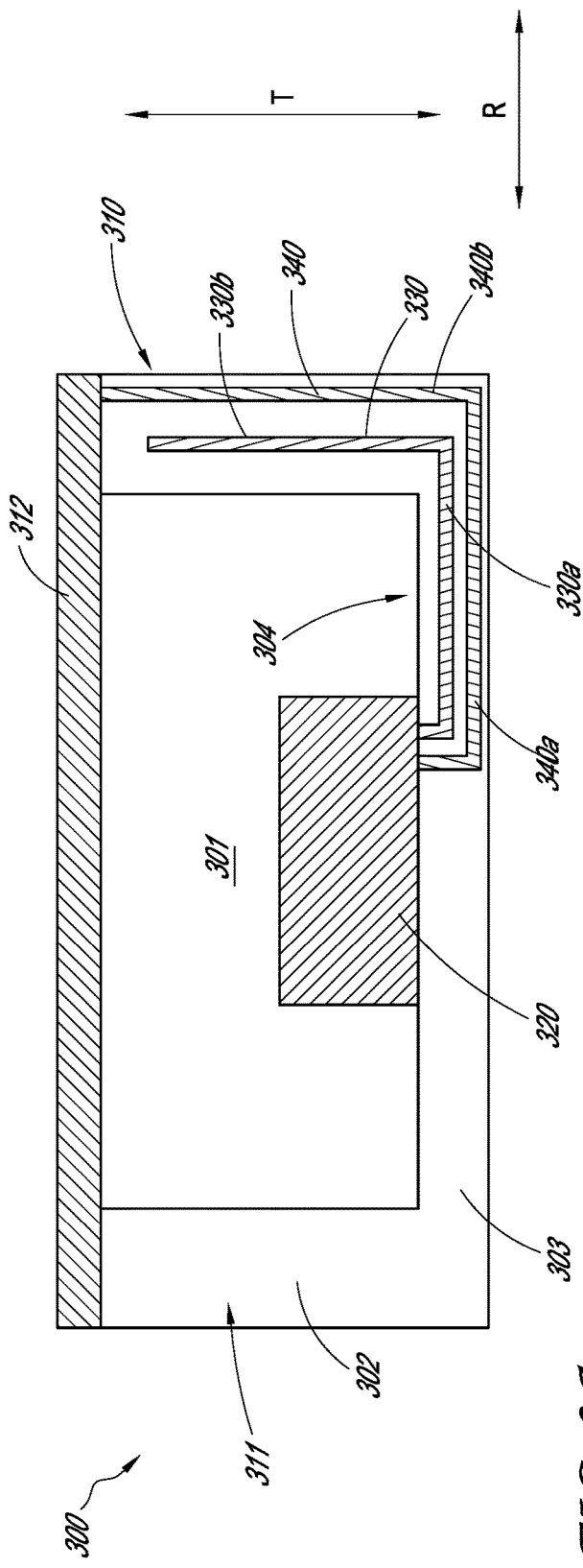
FIG. 3A is a schematic side cross-sectional view of a packaged integrated device having an antenna along a wall of the packaged device, according to one embodiment.
Figure 3B:
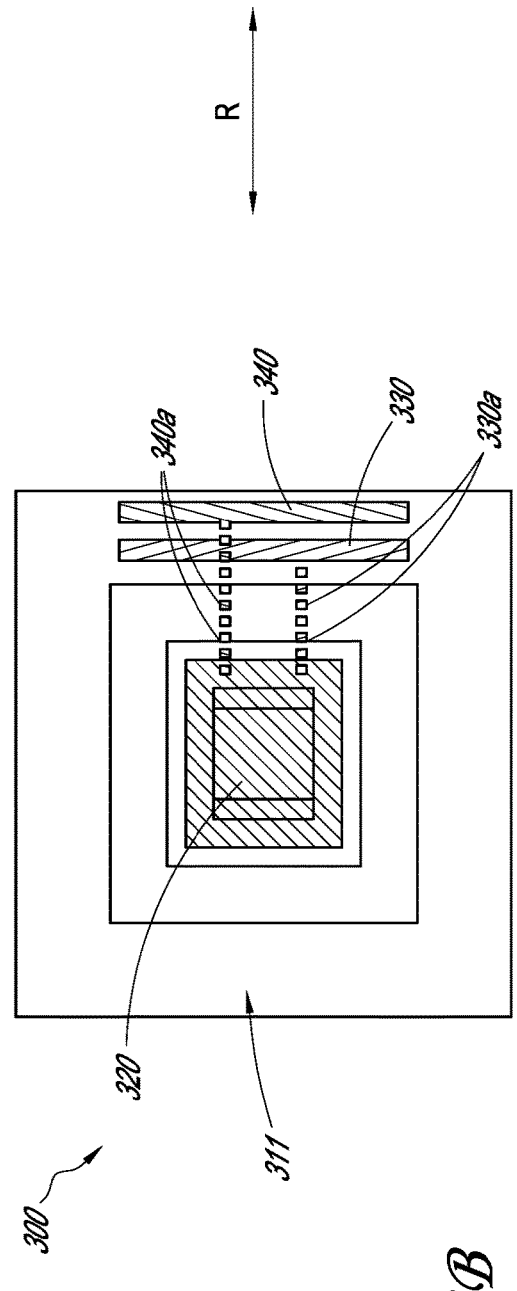
FIG. 3B is a schematic top plan view of the packaged integrated device of FIG. 3A.

Various embodiments disclosed herein relate to packaged integrated devices with one or more directional antennas that are integrated with or coupled to one or more walls of the package. FIG. 3A is a schematic side cross-sectional view of a packaged integrated device 300 (also referred to as a package) according to one embodiment. FIG. 3B is a schematic top plan view of the packaged integrated device 300 of FIG. 3A. The packaged integrated device 300 can include a package body 311 and a package lid 312, collectively referred to as a package housing 310. The package body 311 can comprise a base 303 and one or more walls 302 extending from the base 303 along a non-parallel transverse direction T. As illustrated in FIG. 3B, the package body 311 can comprise four walls disposed about the package interior in a polygonal (e.g., quadrilateral) shape, but in other embodiments, different shapes of the wall 302 may be used. As shown in FIG. 3A, the package lid 312 can be mounted to distal ends of the walls 302 to define a cavity 301. In various embodiments, the cavity 301 may be filled with air. In still other embodiments, a molding compound, inert gas or other filler material can be provided in the cavity 301 (in which case there may or may not be a package lid). The package body 311 (e.g., the walls 302 and the base 303) can comprise a ceramic structure in various embodiments. In other embodiments, the package body 311 can comprise a polymer or a laminate substrate in which the cavity 301 is defined. Still other types of package bodies may be used for the embodiments disclosed herein.

The packaged integrated device 300 further includes an integrated device die 320 disposed on a mounting surface 304 of the base 303 of the package body 311. In other embodiments, the integrated device die 320 may be mounted on other surfaces of the package body 311. As explained above, the integrated device die 320 can comprise any suitable device die, such as a processor die (e.g., Application Specific Integrated Circuit, or ASIC), a sensor die, a memory die, etc. The integrated device die 320 can be disposed within the cavity 301 in the illustrated embodiment. In other embodiments, a molding compound or encapsulant can be disposed over the die. In the illustrated embodiment, the die 320 is flip chip mounted to the base 303 such that bond pads of the die 320 electrically connect to corresponding contacts of the base 303 (e.g., by intervening conductive adhesive, such as solder or anisotropic conductive film). In other embodiments, the die 320 can be wire bonded to pads or traces on the base 303.

In some embodiments, the packaged integrated device 300 can include an antenna disposed along the wall(s) 302 of the package 300. As with the embodiments of FIGS. 1A-2, the antenna can comprise a radiating element 340 and a grounded element 330 spaced apart from the radiating element 340 by an intervening non-conductive or dielectric material. The radiating element 340 may be similar to the radiating element 111, 211 of FIGS. 1A-2, and the grounded element 330 may be similar to the grounded element 112, 212 of FIGS. 1A-2. The radiating element 340 and/or the grounded element 330 can comprise any suitable metal, such as copper. The dimension of the radiating element 340 along the transverse direction T can be in a range of 1 mm to 5 cm. The package wall 302 may comprise a dielectric material that electrically separates the radiating element 340 and the grounded element 330. As explained above, the antenna, including the radiating element 340, the grounded element 330 and the intervening dielectric, can be used for transmitting and/or receiving electromagnetic signals from and/or to the package 300.

In the embodiment shown in FIGS. 3A-3B, the radiating element 340 can be disposed vertically along the wall 302 of the package body 311, e.g., disposed along the transverse direction T which may be non-parallel to the mounting surface 304. The grounded element 330 can also be placed vertically along the wall 302 between the radiating element 340 and the integrated device die 320. The length of the radiating and grounded elements 340, 330 may thus be longer along the transverse direction T along the height of the walls than a lateral thickness of the radiating and grounded elements 340, 330. As shown in FIGS. 3A and 3B, the grounded element 330 can include a first trace portion 330a that provides electrical communication between the integrated device die 320 (e.g., by way of the flip chip connection between the die 320 and the base 303) and a second portion 330b disposed vertically along the wall 302. Similarly, the radiating element 340 can include a first trace portion 340a that provides electrical communication between the integrated device die 320 (e.g., by way of the flip chip connection between the die 320 and the base 303) and a second portion 340b disposed vertically along the wall 302. As shown in FIGS. 3A-3B, the grounded element 330 and the radiating element 340 can be completely embedded in the package body 311 (e.g., embedded in the wall 302). In other embodiments, however, the radiating element 340 may be disposed on an exterior surface of the wall 302, and/or the grounded element 330 may be disposed on an interior surface of the wall 302 (e.g., exposed to the cavity 301).

A radiation direction R of the radiating element 340 may be generally perpendicular to the wall 302 of the package body 311 in the illustrated embodiment, e.g., signals may be transmitted from and/or received by the package 300 along the radiation direction R. In the embodiment of FIGS. 3A-3B, the antenna (comprising the radiating element 340, the grounded element 330, and the portion of the wall 302 intervening between the radiating element 340 and the grounded element 330) may be disposed along only one vertical wall 302 of the package 300, such that electromagnetic radiation propagates generally along one direction R. Beneficially, therefore, in the embodiment of FIGS. 3A-3B, the package 300 can be installed in the larger electronic system so as to position the wall 302 to which the antenna is coupled facing the preferred direction of transmission and/or reception. However, as explained below, multiple antennas can be provided to enable multi-directional radiation.

Figures 4A, 4B:
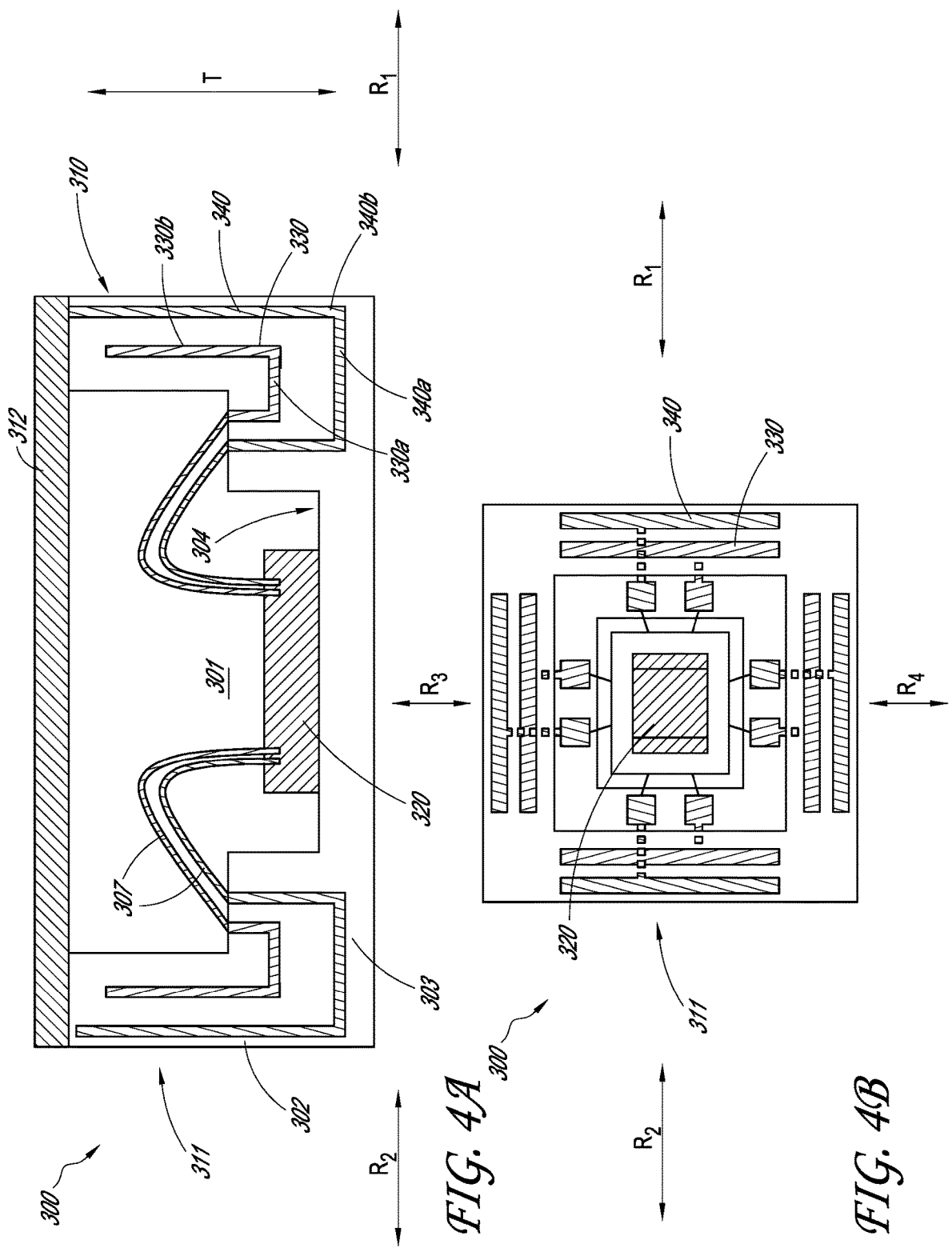
FIG. 4A is a schematic side cross-sectional view of a packaged integrated device having a plurality of antennas disposed along a corresponding plurality of walls, according to another embodiment.
FIG. 4B is a schematic top cross-sectional view of the packaged integrated device shown in FIG. 4A.

FIG. 4A is a schematic side cross-sectional view of a packaged integrated device 300 according to another embodiment. FIG. 4B is a schematic top cross-sectional view of the packaged integrated device 300 shown in FIG. 4A. Unless otherwise noted, the components of the package 300 shown in FIGS. 4A-4B may be the same as or generally similar to like numbered components shown in FIGS. 3A-3B. For example, as with the embodiment of FIGS. 3A-3B, the integrated device die 320 can be mounted to the mounting surface 304 of the base 303 within the cavity 301. Unlike the illustrated embodiment of FIGS. 3A-3B, the integrated device die 320 of FIGS. 4A-4B can be wire bonded to traces of the package body 311 by way of bonding wires 307. In the illustrated embodiment, the bond wires 307 connect to the traces on a ledge of the package body 311. In other embodiments, however, the die can be wire bonded to pads on the base of the package body, or can be flip chip mounted to the base 303 as in FIGS. 3A-3B.

As with the embodiment of FIGS. 3A-3B, at least one antenna (e.g., the radiating element 340, the grounded element 330, and the intervening portion of the nonconductive wall 302) can be positioned on or in the wall 302 of the package body 311. In the embodiment of FIGS. 3A-3B, the package 300 of FIGS. 4A-4B can include a plurality of antennas (e.g., a corresponding plurality of radiating elements 340 and spaced apart grounded elements 330) disposed along a plurality of the walls 302. In the illustrated embodiment, four radiating elements 340 and four grounded elements 330 can be placed vertically inside the package body 311 along four corresponding package walls 302. However, it should be appreciated that any suitable number of walls 302 and corresponding antennas may be provided with other polygonal package shapes. As in FIGS. 3A-3B, each grounded element 330 can be placed between the corresponding radiating element 340 and the integrated device die 320. Moreover, in the illustrated embodiment, the radiating elements 340 and the grounded elements 330 are embedded in the package body 311.

Beneficially, the multiple radiating elements 340 and grounded elements 330 shown in FIGS. 4A-4B can be designed so as to form a beam of electromagnetic radiation along multiple directions. For example, in the embodiment of FIGS. 4A-4B, in which four walls 302 include antennas, radiation may be transmitted and/or received along four radiation directions $R_1$, $R_2$, $R_3$, $R_4$. Moreover, the integration of the antennas in the package walls 302 can be cost efficient and easily manufactured using packaging techniques to couple the antenna to the walls 302.

FIG. 4C is a schematic top cross-sectional view of a packaged integrated device 300 according to another embodiment. Unless otherwise noted, the components of the package 300 shown in FIG. 4C may be the same as or generally similar to like numbered components shown in FIGS. 3A-4B. For example, as with the embodiments of FIGS. 4A-4B, one or more antennas (e.g., the radiating element(s) 340, grounded element(s) 330 and intervening non-conductive portion of the wall 302) can be disposed (e.g., vertically) along one or a plurality of walls 302 of the package body 311. For example, the package body 311 can include four walls 302, but any suitable number of walls may be provided. Each of the walls 302 can have an exterior surface 306 and an interior surface 308. In the illustrated embodiment, the radiating elements 340 can be disposed along the exterior surfaces 306 of the walls 302. The grounded elements 330 can be disposed along the interior surfaces 308 of the walls 302, e.g., the grounded elements 330 may be exposed to the cavity 301 (FIG. 4A).

FIG. 4D is a schematic top cross-sectional view of a packaged integrated device 300, according to another embodiment. Unless otherwise noted, the components of the package 300 shown in FIG. 4D may be the same as or generally similar to like numbered components shown in FIG. 4C. However, unlike the embodiment of FIG. 4C, in the embodiment of FIG. 4D, the grounded element 330 can comprise an annular or closed loop around the cavity 301 and/or the device die 320. In the package 300 of FIG. 4D, therefore, continuously connected sidewall ground plates may be provided to define a common ground for the antennas disposed along the walls 302 of the package 300. Thus, in the embodiments disclosed herein, a plurality of grounded elements 330 may be associated with corresponding radiating elements 340, or the grounded elements 330 can be interconnected (or can define a single closed structure) to provide continuously connected sidewall ground plates.

FIG. 5A is a schematic top cross-sectional view of a packaged integrated device 300 that includes an angled or curved antenna in the wall 302 of the package body 311, according to another embodiment. Unless otherwise noted, the components of the package 300 shown in FIG. 5A may be the same as or generally similar to like numbered components shown in FIGS. 3A-4D. For example, as with the embodiments described in connection with FIGS. 3A-4D, an antenna (e.g., the radiating element 340, the grounded element 330, and intervening non-conductive material) can extend (e.g., vertically) along the wall 302 of the package body 311. In FIG. 5A, for example, the radiating and grounded elements 340, 330 can be at least partially (e.g., completely) embedded in the wall 302. As explained herein, the package body 311 can comprise an overmolded package in which encapsulant is disposed over the die 320, in which case the wall 302 comprises vertical sidewalls of the package 300. In other embodiments, the package body 311 can comprise a cavity package such as the package 300 of FIG. 3A.

Unlike the embodiment of FIGS. 3A-4D, however, the radiating element 340 and the grounded element 330 of FIG. 5A may be angled or curved. For example, as shown in FIG. 5A, each of the radiating element 340 and the grounded element 330 can include an inner segment 313 and one or more (e.g., two) outer segments 314 that extend outwardly from the inner segment 313 relative to the integrated device die 320. In the implementation of FIG. 5A, the outer segments 314 of the radiating element 340 and the grounded element 330 can be angled outwardly relative to the inner segment 313 at an angled or bent portion 309. In the illustrated embodiment, the angled portion 309 can comprise a corner that positions relatively linear inner and outer segments 313, 314 at an angle relative to one another. However, in other embodiments, the angled or bent portion can be curved or smooth such that the radiating element and/or the grounded element define a rounded or curved profile in the wall.

The curved or angled shape of the radiating element 340 and the grounded element 330 can structurally and functionally approximate a parabolic antenna in some embodiments, which can beneficially transmit or receive radiation across a narrow, or well-controlled angle (see radiation directions R in FIG. 5B). In the embodiment of FIG. 5A, as with the embodiment of FIGS. 3A-3B, the antenna can be disposed along only one wall 302, so as to transmit and/or receive electromagnetic radiation generally along the radiation direction R, which may be perpendicular to the wall 302, but may transmit and/or receive radiation at multiple angles from and/or to the wall 302. However, as explained below in connection with FIGS. 5B-5C, multiple castellated or angled antennas can be disposed along multiple walls 302. The angled antennas may be formed in any suitable manner. For example, the angled segments 313, 314 can be defined by stacking layers of ceramic material or by 3D printing methods, such as those described in U.S. Pat. No. 9,156,680, issued Oct. 13, 2015, the entire contents of which are incorporated by reference herein for all purposes. Moreover, although antennas in FIGS. 5A and 5B are illustrated with three segments (e.g., inner segment 313 and two outer segments 314), it should be appreciated that any other shape or number of segments can be used to define the antenna in the wall 302 of the package 300.

FIG. 5B is a schematic top cross-sectional view of a packaged integrated device 300. Unless otherwise noted, the components of the package 300 shown in FIG. 5B may be the same as or generally similar to like numbered components shown in FIG. 5A. As with FIG. 5A, a radiating element 340 and a grounded element 330 can be disposed inside of a package body 311, e.g., along and embedded in a vertical wall 302. Unlike FIG. 5A, however, in FIG. 5B, a plurality of antennas (including a plurality of radiating elements 340 and a corresponding plurality of grounded elements 330) can be disposed along multiple walls 302 of the package 300. At least one or all radiating elements 340 and grounded elements 330 can be curved and/or angled as explained above. Each grounded element 330 can be placed between the corresponding radiating element 340 and the integrated device die 320. As shown in FIG. 5C, the angled antennas can enable the package 300 to transmit and/or receive radiation over a controlled angle θ, as shown in FIG. 5C. The angle θ can be in a range of 1° to 90°, such as in the range of about 1° to 45°.

FIG. 5C is a schematic top cross-sectional view of a packaged integrated device 300. Unless otherwise noted, the components of the package 300 shown in FIG. 5C may be the same as or generally similar to like numbered components shown in FIG. 5B. Unlike the embodiment of FIG. 5B, which includes a plurality of grounded elements 330 corresponding to the plurality of radiating elements 340, in FIG. 5C, the grounded elements 330 are interconnected or otherwise form continuously connected sidewall ground plates (as explained above in connection with FIG. 4D). In the illustrated embodiment, all grounded elements 330 can be connected inside the package body 311 and can be curved or angled as explained above. For example, in FIG. 5C, the grounded elements 330 can comprise the inner segment 313 and a plurality of outer segments 314 extending away from the device die 320 by way of the angled or bent portion 309. In FIG. 5C, for example, the outer segments 314 can extend diagonally substantially to the corner of the package body 311. As shown in FIG. 5C, the radiating element 340 can be linear, e.g., not angled or curved. However, in other embodiments, the radiating element may be angled or curved.

FIG. 6A is a schematic top sectional view of a packaged integrated device 300 having a plurality of angled or curved antennas along multiple walls 302 of the package 300. Unless otherwise noted, the components of the package 300 shown in FIG. 6A may be the same as or generally similar to like numbered components shown in FIGS. 5A-5C. Unlike the embodiment of FIGS. 5A-5C, however, the radiating elements 340 may be disposed on the exterior surface 306 of the package wall 302, similar to the embodiments of FIGS. 4C-4D. Moreover, the grounded elements 330 may be disposed on the interior surface 308 of the package wall 302, exposed to the cavity 301. As with FIGS. 5A-5C, the radiating element 340 can include an inner segment 313 and an outwardly-extending outer segment 314, e.g., the outer segment 314 extends away from the die 320. The angled or bent portion 309 can be curved in various embodiments.

FIG. 6B is a schematic top sectional view of a packaged integrated device 300 having a plurality of castellated antennas along multiple walls 302 of the package 300, and a common grounded element 330. Unless otherwise noted, the components of the package 300 shown in FIG. 6B may be the same as or generally similar to like numbered components shown in FIG. 5A. Unlike, FIG. 6A, however, the grounded element 330 can be connected together or otherwise define continuously connected sidewall ground plates (similar to the embodiment of FIGS. 4D and 5C). Moreover, outer corner regions 328 of the radiating element 340 may be curved or rounded in FIG. 6B. FIG. 6C is a schematic top sectional view of a packaged integrated device 300 having a plurality of castellated antennas along multiple walls 302 of the package 300, and a continuously connected (e.g., annular or closed) grounded element 330, according to another embodiment. Unlike FIG. 6B, the outer corner regions 328 of the grounded element 330 may be angled by a sharp corner (e.g., 90°).

It should be appreciated that the shapes of the radiation element 340 and the grounded element of 330; the relative positions of the radiation element 340, the grounded element 330 and the package body 311; the directions of the radiation element 340 and the grounded element 330, disclosed herein are examples. Skilled artisans would appreciate that variations of the shapes and orientations are possible.

Applications

Devices employing the above described schemes can be implemented into various electronic devices. Examples of the electronic devices can include, but not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, automobiles, a mobile phone, a telephone, a television, a computer monitor, a computer, a hand-help computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washing/dryer, a copier, a facsimile machine, a scanner, a multi-functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in details, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus it is intended that the scope of the present invention herein disclosed should not be limited by the particular disclosed embodiments described above, but should be determined only by a fair reading of the claims that follow.

What is claimed is:

1. A packaged integrated device, comprising:
   a package body comprising a base and at least one side wall extending non-parallel from the base, the base and the at least one side wall disposed at least partially around a cavity;
   an integrated device die mounted to the base within the cavity of the package body;
   a plurality of radiating elements including a first radiating element, the first radiating element disposed along and integrated with the at least one side wall of the package body, the plurality of radiating elements disposed in different directions, the first radiating element of the plurality of radiating elements comprising a curved or angled portion and a plate portion, the first radiating element disposed along an exterior surface of the at least one side wall and generally parallel with the at least one side wall, the curved or angled portion disposed relative to the plate portion so as to define a concave outer surface of the radiating element; and
   a grounded element disposed along and integrated with the at least one side wall of the package body and positioned between at least one radiating element of the plurality of radiating elements and the integrated device die.

2. The packaged integrated device of claim 1, wherein the at least one side wall comprises a plurality of walls, each wall of the plurality of walls having a corresponding radiating element of the plurality of radiating elements coupled or formed thereto, the packaged integrated device further comprising a plurality of grounded elements disposed along a corresponding plurality of walls of the package body.

3. The packaged integrated device of claim 2, wherein each grounded element of the plurality of grounded elements is spaced from a corresponding one of the plurality of radiating elements by an intervening non-conductive material, with each of the grounded elements of the plurality of grounded elements being disposed between the corresponding one of the radiating elements and the integrated device die.

4. The packaged integrated device in claim 2, wherein each radiating element of the plurality of radiating elements is disposed along a corresponding exterior surface of the plurality of walls, and wherein each grounded element of the plurality of grounded elements is disposed along a corresponding interior surface of the plurality of walls.

5. The packaged integrated device of claim 1, wherein each radiating element of the plurality of radiating elements is curved or angled.

6. The packaged integrated device of claim 1, wherein the first radiating element of the plurality of radiating elements comprises an inner segment and one or more outer segments angled away from the integrated device die, the one or more outer segments being angled away from the integrated device die to control a radiating direction of the first radiating element.

7. The packaged integrated device of claim 1, wherein the package body comprising a ceramic structure, a polymer substrate, or a laminate substrate.

8. The packaged integrated device of claim 1, wherein the integrated device die and the first radiating element are electrically connected by a first interconnect, and the integrated device die and the grounded element are electrically connected by a second interconnect.

9. The packaged integrated device of claim 1, wherein a radiating direction of the first radiating element is generally perpendicular to the at least one side wall of the package body.

10. The packaged integrated device of claim 1, further comprising a package lid mounted to the at least one side wall to define the cavity, wherein the cavity is filled with a gas.

11. The packaged integrated device die of claim 1, wherein an encapsulant is disposed in the cavity over the integrated device die.

12. The packaged integrated device of claim 1, wherein the integrated device die comprises a processor die.

13. The packaged integrated device of claim 3, wherein the plurality of radiating elements, the grounded element, and the non-conductive material define an antenna configured to transmit or receive electromagnetic signals.

14. The packaged integrated device of claim 3, wherein the non-conductive material comprises a dielectric material.

15. The packaged integrated device of claim 1, wherein the grounded element comprises a continuously connected grounded element disposed about the integrated device die.

16. The packaged integrated device of claim 1, wherein the at least one side wall is integrally formed with the base.

17. A packaged integrated device, comprising:
   a package body comprising a base and at least one side wall extending non-parallel from the base, the at least one side wall being integrally formed with the base;
   an integrated device die mounted to the base within the package body;
   an angled or curved radiating element disposed along and integrated with an exterior surface of the at least one side wall of the package body, the angled or curved radiating element comprising a plate portion generally parallel with the at least one side wall and an angled or curved portion extending outwardly from the plate portion to define a concave outer surface of the angled or curved radiating element; and
   a grounded element disposed along and integrated with the at least one side wall of the package body and positioned between the angled or curved radiating element and the integrated device die.

18. The packaged integrated device of claim 17, further comprising a plurality of radiating elements and a plurality of grounded elements, each grounded element of the plurality of grounded elements being disposed between a corresponding radiating element of the plurality of radiating elements and the integrated device die.

19. A packaged integrated device, comprising:
   a package body comprising a base and at least one side wall extending non-parallel from the base, the at least one side wall disposed at least partially around a cavity;
   an integrated device die mounted to the base within the cavity of the package body, the integrated device die and the at least one side wall being laterally spaced apart;
   a plurality of radiating elements, the plurality of radiating elements comprising a first angled or curved radiating element disposed along an exterior surface of the at least one side wall of the package body, the plurality of radiating elements disposed in different directions, the first angled or curved radiating element including a plate portion generally parallel with the at least one side wall and an extension from the plate portion to define a concave outer surface of the radiating element; and
   a grounded element disposed along the at least one side wall of the package body and positioned between at least one radiating element of the plurality of radiating elements and the integrated device die.

20. The packaged integrated device of claim 19, wherein the at least one side wall is integrally formed with the base, and the plurality of radiating elements are integrated with the at least one side wall.

\* \* \* \* \*